(12) United States Patent
Kimura et al.

(10) Patent No.: US 7,683,295 B2
(45) Date of Patent: Mar. 23, 2010

(54) HEATING ELEMENT

(75) Inventors: Noboru Kimura, Gunma (JP); Takuma Kushihashi, Gunma (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 804 days.

(21) Appl. No.: 11/498,714

(22) Filed: Aug. 4, 2006

(65) Prior Publication Data
US 2007/0045271 A1    Mar. 1, 2007

(30) Foreign Application Priority Data
Aug. 9, 2005  (JP) ............ 2005-230633
Jan. 26, 2006 (JP) ............ 2006-017306

(51) Int. Cl.
H05B 3/06   (2006.01)
H05B 3/08   (2006.01)
H05B 3/16   (2006.01)
H05B 3/68   (2006.01)

(52) U.S. Cl. .......... 219/541; 219/444.1; 219/543

(58) Field of Classification Search ............ None
See application file for complete search history.

(56) References Cited

U.S. PATENT DOCUMENTS

| | | | | |
|---|---|---|---|---|
| 6,160,244 | A * | 12/2000 | Ohashi ........... | 219/444.1 |
| 7,364,624 | B2 * | 4/2008 | Mariner et al. ....... | 118/725 |
| 2007/0131674 | A1 * | 6/2007 | Kushihashi et al. ....... | 219/543 |

FOREIGN PATENT DOCUMENTS

JP    A 4-358074    12/1992
JP    A 5-109876    4/1993
JP    A 5-129210    5/1993

(Continued)

OTHER PUBLICATIONS

"Vacuum"; No. 12 (33); pp. 53-54.

*Primary Examiner*—Joseph M Pelham
(74) *Attorney, Agent, or Firm*—Oliff & Berridge, PLC

(57) ABSTRACT

There is disclosed a heating element 10 comprising:
a single-piece heat-resistant base member 1 with a plate portion 1a in which a heater pattern 3a is formed, a rod portion 1b extending from one surface of the plate portion 1a and in which a current-carrying part 3b is formed, and an end portion 1c at an end of the rod portion 1b on the opposite side of the plate portion 1a and in which a power-supply terminal 3c is formed;
a dielectric layer 2 with insulating property on the surface of the heat-resistant base member 1;
a conductive layer 3 with conductive property on the dielectric layer 2, in which the conductive layer 3 is formed as the heater pattern 3a in the plate portion 1a, as the current-carrying part 3b in the rod portion 1b, and as the power-supply terminal 3c in the end portion 1c; and
a protection layer 4 with insulating property which covers the surface of the heater pattern 3a and the current-carrying part 3b, in which the dielectric layer 2, the conductive layer 3 and the protection layer 4 are formed to unite with the heat-resistant base member 1. There can be provided a heating element resistant to corrosion of a power-supply terminal, with a long-life protection layer, with high durability, compact in size, and capable of being produced at a low cost.

14 Claims, 5 Drawing Sheets

FOREIGN PATENT DOCUMENTS

| | | |
|---|---|---|
| JP | A 6-61335 | 3/1994 |
| JP | A 8-500932 | 1/1996 |
| JP | EP 0 746 010 A2 | 12/1996 |
| JP | A 11-354260 | 12/1999 |
| WO | WO 94/08436 | 4/1994 |
| WO | WO 99/45745 | 9/1999 |
| WO | WO 02/17384 A1 | 2/2002 |
| WO | WO 2004/068541 A2 | 8/2004 |
| WO | WO 2004068541 A2 * | 8/2004 |

* cited by examiner (A)

(B)

(C)

HEATING ELEMENT

BACKGROUND OF THE INVENTION

1. Field of the Invention

The present invention relates to a heating element at least including a heating portion in which a heater pattern is formed in a plate portion of a heat-resistant base member, and a power-supply-terminal portion in which a power-supply terminal is formed in the heat-resistant base member.

2. Description of the Related Art

A heater in which a line or foil of metal having a high melting point such as molybdenum or tungsten is wrapped around or bonded to a heat-resistant base member made of sintered ceramic such as alumina, aluminum nitride or zirconia has been used for heating semiconductor wafers in manufacturing steps of semiconductor devices.

However, such a heater has drawbacks of being prone to deform or vaporize because the heating element is made of metal, being short-life, and being complicated to assemble (see the pyrolytic graphite/pyrolytic boron nitride heater from Union Carbide Services provided in "Vacuum" No. 12, (33), p. 53). Furthermore, use of sintered ceramic for the heat-resistant base member causes a problem that the binder in the sintered ceramic becomes impurities.

Then, to prevent such deformation or scattering of impurities due to a heat cycle, a ceramic heater is developed. The ceramic heater has a heat-resistant base member of pyrolytic boron nitride (PBN) having high mechanical strength and enabling high-efficiency heating, and a conductive layer of pyrolytic graphite on the heat-resistant base member (for example, see the pyrolytic graphite/pyrolytic boron nitride heater from Union Carbide Services provided in "Vacuum" No. 12, (33), p. 53; published Japanese translations of PCT international publication for patent applications No. H08-500932; Japanese Patent Laid-open (Kokai) No. H05-129210; and Japanese Patent Laid-open (Kokai) No. H06-61335).

An example of a heating element of such a heater is shown in FIG. 4. A heating element 20 has at least a heating portion 20a in which a heater pattern 3a is formed on a plate-shaped heat-resistant base member 21, and a power-supply-terminal portion 20c in which power-supply terminals 3c are formed at the rim of the surface of the heat-resistant base member 21 on which the heater pattern is formed. A protection layer 4 covers the heater pattern 3a. To the power-supply terminal 3c a power-supply member or a power terminal 5 is connected.

However, pyrolytic graphite used for the heating body is prone to undergo corrosion due to oxidation. Pyrolytic graphite has also reactivity with high-temperature gases used in the heating process. For example, hydrogen gas changes pyrolytic graphite into methane gas. Therefore, there is a problem that remaining oxygen or high-temperature gases in the process environment corrodes pyrolytic graphite in the power-supply-terminal portion exposed for power supply, and the power-supply-terminal portion is short-life.

To solve the problem, an attempt to locate the power-supply-terminal portion away from the heating portion is made. For example, the following solution is suggested: a power-supply terminal is connected to a power-terminal member via a power-supply member having a heater pattern which produces heat by energization. Insulating ceramic such as PBN is used for a protection layer covering the heater pattern, thereby preventing overheating of the power-supply-terminal portion to increase longevity of the power-supply terminal (see Japanese Patent Laid-open (Kokai) No. H11-354260).

Furthermore, the following method is suggested: assembling the power-supply-terminal portion made of carbon with an assembly part and forming a protection layer (see published Japanese translations of PCT international publication for patent applications No. H08-500932; International Publication WO2004/068541).

However, such a heating element has protrusions on the heating surface. It is necessary to provide a space between the heating surface and an object to be heated, which hampers compact design of the heating element. In addition, a protection layer in the vicinity of a connected part assembled from plural components is apt to produce cracks through usage. A conductive layer begins to corrode from the cracks, which causes a problem to shorten the life of the heating element. Furthermore, when the heating element is used in an environment corroding boride such as using halide etching gas, there is a drawback that an outermost layer of boride lacks resistance to corrosion, and corrosion of the outermost layer shortens the life of the heating element.

Use of pyrolytic boron nitride for a material of a heat-resistant base member as mentioned above gives high mechanical strength and enables high-efficiency heating. However, pyrolytic boron nitride has high anisotropy and is apt to warp. Pyrolytic boron nitride is also expensive. Therefore, use of sintered boron nitride for the heat-resistant base member is also suggested (see Japanese Patent Laid-open (Kokai) No. H04-358074).

However, when sintered boron nitride is used for the heat-resistant base member, the base member lacks mechanical strength, and it is necessary to thicken the base member. In addition, an amount of heat escaping from the side of the base member is huge. Therefore, it is impossible to rise temperature of a test sample sufficiently, especially high temperature of more than 700° C.

In addition, an advanced ceramic heater with electrostatic chuck on a heater for holding a semiconductor wafer to be heated is suggested currently (see Japanese Patent Laid-open (Kokai) No. H05-129210; Japanese Patent Laid-open (Kokai) No. H06-61335; Japanese Patent Laid-open (Kokai) No. H04-358074; Japanese Patent Laid-open (Kokai) No. H05-109876). However, the heater does not have sufficient heat resistance.

SUMMARY OF THE INVENTION

The present invention has been accomplished to solve the above-mentioned problems, and a main object of the present invention is to provide a heating element resistant to corrosion of a power-supply terminal, with a long-life protection layer, with high durability, compact in size, and capable of being produced at a low cost.

To achieve the above object, the present invention provides a heating element comprising: at least a single-piece heat-resistant base member with a plate portion in which a heater pattern is formed, a rod portion extending from one surface of the plate portion and in which a current-carrying part is formed, and an end portion at an end of the rod portion on the opposite side of the plate portion and in which a power-supply terminal is formed;

a dielectric layer with insulating property on the surface of the heat-resistant base member;

a conductive layer with conductive property on the dielectric layer, in which the conductive layer is formed as the heater pattern in the plate portion, as the current-carrying part in the rod portion, and as the power-supply terminal in the end portion; and a protection layer with insulating property which covers the surface of the heater pattern and the current-carrying part, in which the dielectric layer, the conductive layer and the protection layer are formed to unite with the heat-resistant base member.

In such a heating element, a heating portion in which the heater pattern is formed in the plate portion and a power-supply-terminal portion in which the power-supply terminal is formed in the end portion are separated by the rod portion in which the current-carrying part is formed. Therefore, the power-supply terminal exposed at the power-supply-terminal portion resists corrosion due to high-temperature gases, and has a long life.

In addition, the heat-resistant base member is single-piece, and not assembled from plural components. Therefore, the heating element is compact in size, and capable of being produced at a low cost. The layers formed on the heat-resistant base member resists producing cracks through usage, and have long life.

Furthermore, as mentioned above, the conductive layer is formed as the heater pattern, the current-carrying part, and the power-supply terminal. The protection layer covers the surface of the heater pattern and the current-carrying part. The dielectric layer, the conductive layer and the protection layer are formed to unite with the heat-resistant base member. Therefore, the heating element is compact in size, and capable of being produced at a low cost. The protection layer resists producing cracks through usage, and has long life.

In the above case, it is preferable that the heat-resistant base member is made of graphite.

When the heat-resistant base member is made of graphite, graphite is low-cost, and easy to process to produce even a complicated shape. Therefore, the cost of manufacturing the heating element can be reduced further. Moreover, such a heating element has high heat-resistance.

In addition, it is preferable that the dielectric layer is made of any one of boron nitride, pyrolytic boron nitride, silicon nitride, CVD silicon nitride, aluminum nitride and CVD aluminum nitride, or combination of boron nitride, pyrolytic boron nitride, silicon nitride, CVD silicon nitride, aluminum nitride or CVD aluminum nitride.

When the dielectric layer is made of any one of boron nitride, pyrolytic boron nitride, silicon nitride, CVD silicon nitride, aluminum nitride and CVD aluminum nitride, or combination of boron nitride, pyrolytic boron nitride, silicon nitride, CVD silicon nitride, aluminum nitride or CVD aluminum nitride, the dielectric layer has high insulating property, and does not release impurities under high temperature conditions. Therefore, a heating element with the dielectric layer can also be used for a heating process requiring high purity.

Furthermore, it is preferable that the conductive layer is made of pyrolytic carbon or glassy carbon.

The conductive layer made of pyrolytic carbon or glassy carbon can be heated up to high temperature, and is easily worked. Therefore, the heater pattern is formed as a meandering pattern with different pattern widths, whereby the heater pattern can easily have arbitrary temperature gradient or heating distribution with reference to the thermal environments to heat uniformly.

In addition, it is preferable that the protection layer is made of any one of boron nitride, pyrolytic boron nitride, silicon nitride, CVD silicon nitride, aluminum nitride and CVD aluminum nitride, or combination of boron nitride, pyrolytic boron nitride, silicon nitride, CVD silicon nitride, aluminum nitride or CVD aluminum nitride.

When the protection layer is made of any one of boron nitride, pyrolytic boron nitride, silicon nitride, CVD silicon nitride, aluminum nitride and CVD aluminum nitride, or combination of boron nitride, pyrolytic boron nitride, silicon nitride, CVD silicon nitride, aluminum nitride or CVD aluminum nitride, the protection layer has high insulating property, and does not exfoliate or release impurities under high temperature conditions. Therefore, a heating element with the protection layer can also be used for a heating process requiring high purity.

Furthermore, it is preferable that the protection layer comprises at least 2 or more layers, and an outermost layer is made of any one of aluminum, yttrium, silicon, and a compound of aluminum, yttrium or silicon.

When the protection layer comprises at least 2 or more layers, and an outermost layer is made of any one of aluminum, yttrium, silicon, and a compound of aluminum, yttrium or silicon, the heating element with the protection layer can be used with stability under a corrosive environment using halide etching gas, oxygen, etc. In this case, it is particularly preferable that the outermost layer of the protection layer is made of aluminum nitride and so on as mentioned above. Such an outermost layer is more effective under the corrosive environment.

In addition, it is preferable that the rod portion is 10 to 200 mm long.

When the rod portion is 10 to 200 mm long, the distance between the terminal portion and the heating portion is long enough to keep the terminal portion to be sufficiently a low temperature. Thus corrosion of the terminal portion can be reduced more effectively.

Furthermore, it is possible that the heater pattern is formed in the surface of the plate portion from which the rod portion extends, and an electrostatic-chuck pattern for holding an object to be heated is formed in the opposite surface of the plate portion.

When the heater pattern is formed in the surface of the plate portion from which the rod portion extends, and an electrostatic-chuck pattern for holding an object to be heated is formed in the opposite surface of the plate portion, the object can be heated with being retained. Thus the object can be heated with efficiency and the object can be positioned with high precision. Therefore, when it is required to position the object to be heated with high precision in ion implantation, plasma etching, sputtering and so on, desired heating process can be conducted more accurately with such a heating element.

As described above, the present invention provides a heating element in which the heating portion and the power-supply-terminal portion are separated by the rod portion. Thus the power-supply terminal exposed at the power-supply-terminal portion resists corrosion due to high-temperature gases in a process environment. Because the heat-resistant base member is single-piece, the heating element is compact in size, and capable of being produced at a low cost. Further, the formed layers resist producing cracks.

As described above, the conductive layer is formed as the heater pattern, the current-carrying part, and the power-supply terminal. The protection layer covers the surface of the heater pattern and the current-carrying part. The dielectric layer, the conductive layer and the protection layer are formed to unite with the heat-resistant base member. Thus the heating element is compact in size, and capable of being produced at a low cost. Further, the protection layer resists producing cracks through usage. Therefore, the heating element of the present invention has a very long life.

In particular, when the heat-resistant base member is made of graphite, the cost of manufacturing the heating element can be reduced further because the material to produce the base member is low-cost, and easy to process to produce even a complicated shape. Such a heating element has high heat-resistance.

BRIEF DESCRIPTION OF THE DRAWINGS

FIG. 1A is a section view of the heating element. FIG. 1B is a perspective view of the heating element from which a protection layer is removed. FIG. 1C is a magnified fragmentary sectional view of a conductive portion (the dotted box in FIG. 1A) of the heating element. FIG. 1D is a section view of a heat-resistant base member. FIG. 1E is a perspective view of the heat-resistant base member.

FIG. 2A is a section view of the heating element. FIG. 2B is a perspective view of the heating element from which a protection layer is removed. FIG. 2C is a section view of a heat-resistant base member. FIG. 2D is a perspective view of the heat-resistant base member.

FIG. 3A is a section view of the heating element. FIG. 3B is a perspective view from below of the heating element from which a protection layer is removed. FIG. 3C is a perspective view from above of the heating element from which a protection layer is removed.

FIG. 4A is a section view of the heating element. FIG. 4B is a perspective view of the whole portion in which a conductive layer is formed on a heat-resistant base member. FIG. 4C is a section view of the heat-resistant base member. FIG. 4D is a perspective view of the heat-resistant base member.

FIG. 5A is a section view of the heating element of Example 1. FIG. 5B is a magnified fragmentary sectional view of a conductive portion (the dotted boxes in FIG. 5A and FIG. 5C) of the heating element. FIG. 5C is a section view of the heating element of Example 2.

DESCRIPTION OF THE INVENTION AND A PREFERRED EMBODIMENT

Figure 4:
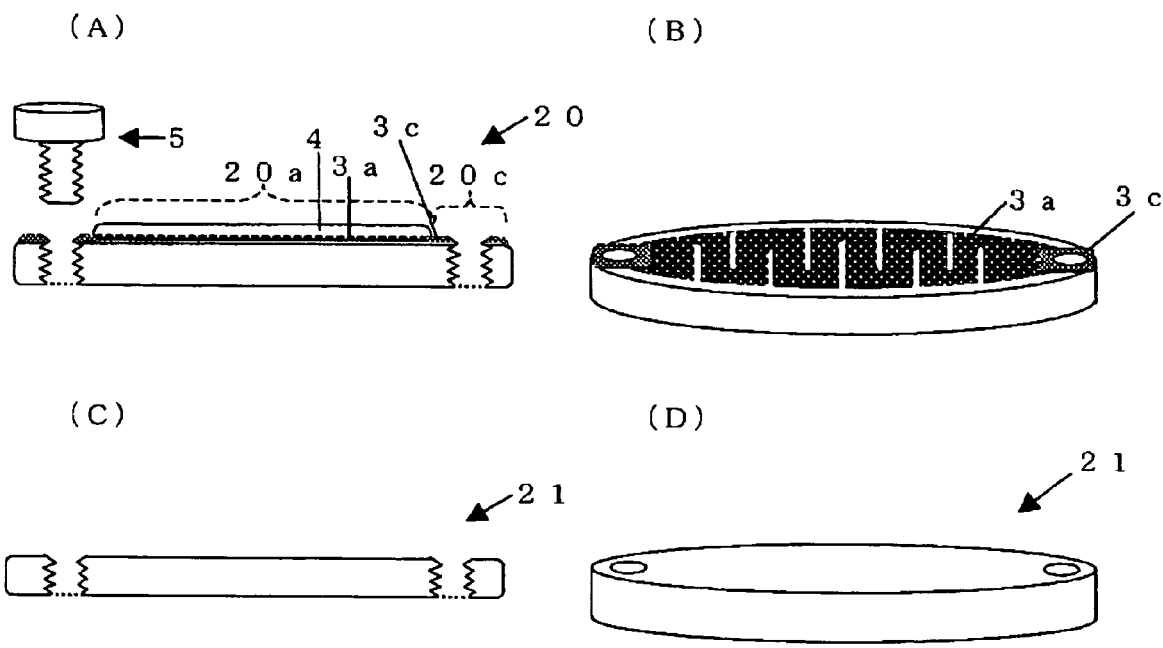
FIG. 4 is a schematic view of one example (Comparative Example) of a conventional heating element.

As shown in FIG. 4, a heating element 20 of a conventional ceramic heater has a heating layer 3a of pyrolytic graphite on a heat-resistant base member 21 of pyrolytic boron nitride. Pyrolytic graphite is prone to undergo corrosion due to oxidation. Pyrolytic graphite has reactivity with high-temperature gases used for a heating process. Therefore, there is a problem that remaining oxygen or high-temperature gases in the process environment corrodes pyrolytic graphite of a power-supply terminal 3c exposed for power supply, and conventional ceramic heaters are short-life.

To solve the problem, several attempts to locate the power-supply-terminal portion away from the heating portion are made. However, there are following problems: such a heating element has protrusions on the heating surface, which hampers compact design of the heating element. In addition, a protection layer in the vicinity of a connected part of the heating element assembled from plural components is apt to produce cracks through usage, which shortens the life of the heating element.

Then, the present inventors have investigated thoroughly. They have found that the following heating element has high durability because deterioration of the power-supply terminal and the protection layer is reduced; the heating element is compact in size; and capable of being produced at a low cost.

The present invention provides a heating element comprising: at least a single-piece heat-resistant base member with a plate portion in which a heater pattern is formed, a rod portion extending from one surface of the plate portion and in which a current-carrying part is formed, and an end portion at an end of the rod portion on the opposite side of the plate portion and in which a power-supply terminal is formed;

a dielectric layer with insulating property on the surface of the heat-resistant base member;

a conductive layer with conductive property on the dielectric layer, in which the conductive layer is formed as the heater pattern in the plate portion, as the current-carrying part in the rod portion, and as the power-supply terminal in the end portion; and a protection layer with insulating property which covers the surface of the heater pattern and the current-carrying part, in which the dielectric layer, the conductive layer and the protection layer are formed to unite with the heat-resistant base member.

Hereinafter, an embodiment according to the present invention will be further described in detail referring to the appended drawings. However, the present invention is not limited thereto.

Figure 1:
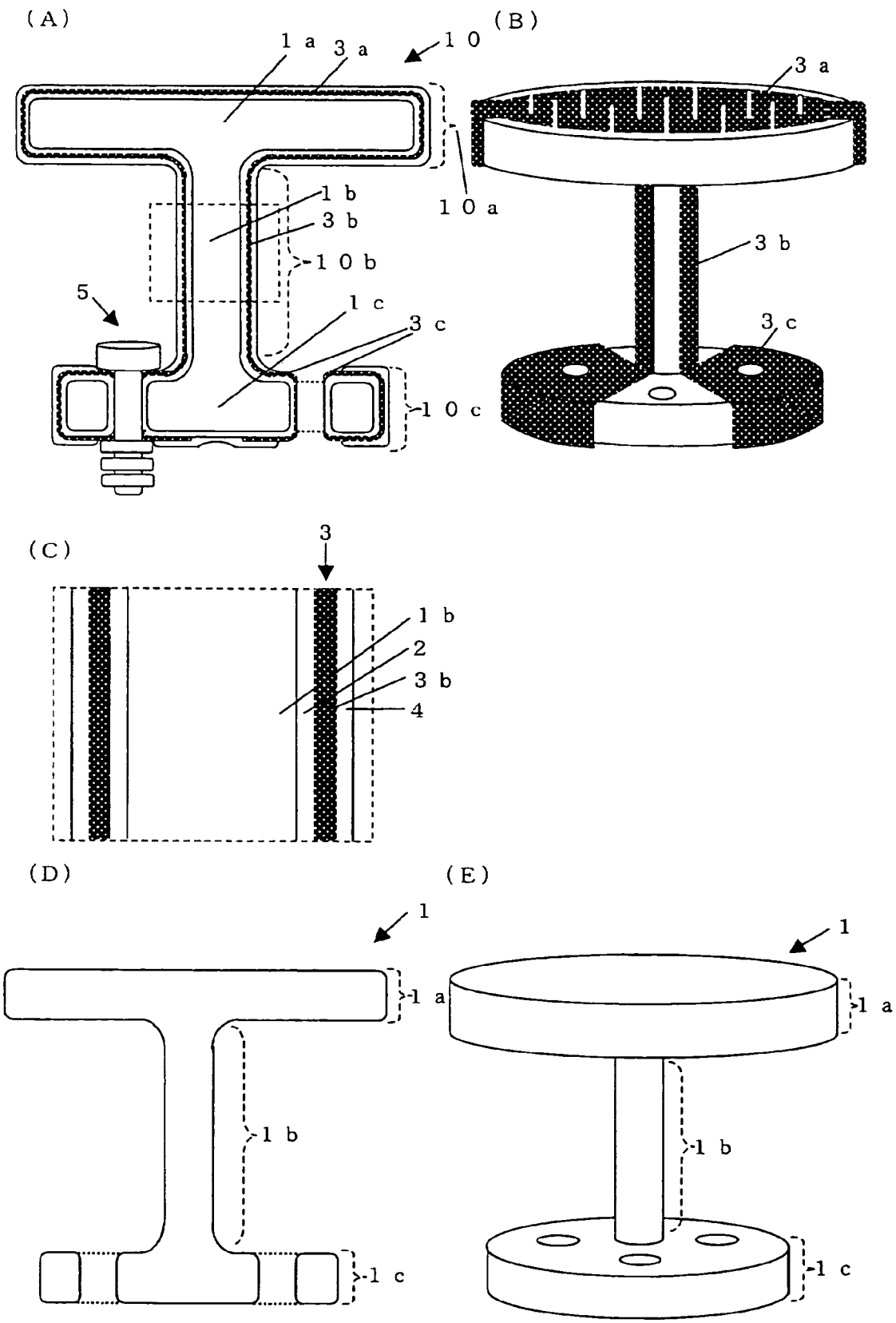
FIG. 1 is a schematic view of one embodiment (Example 1) of a heating element according to the present invention.
Figure 2:
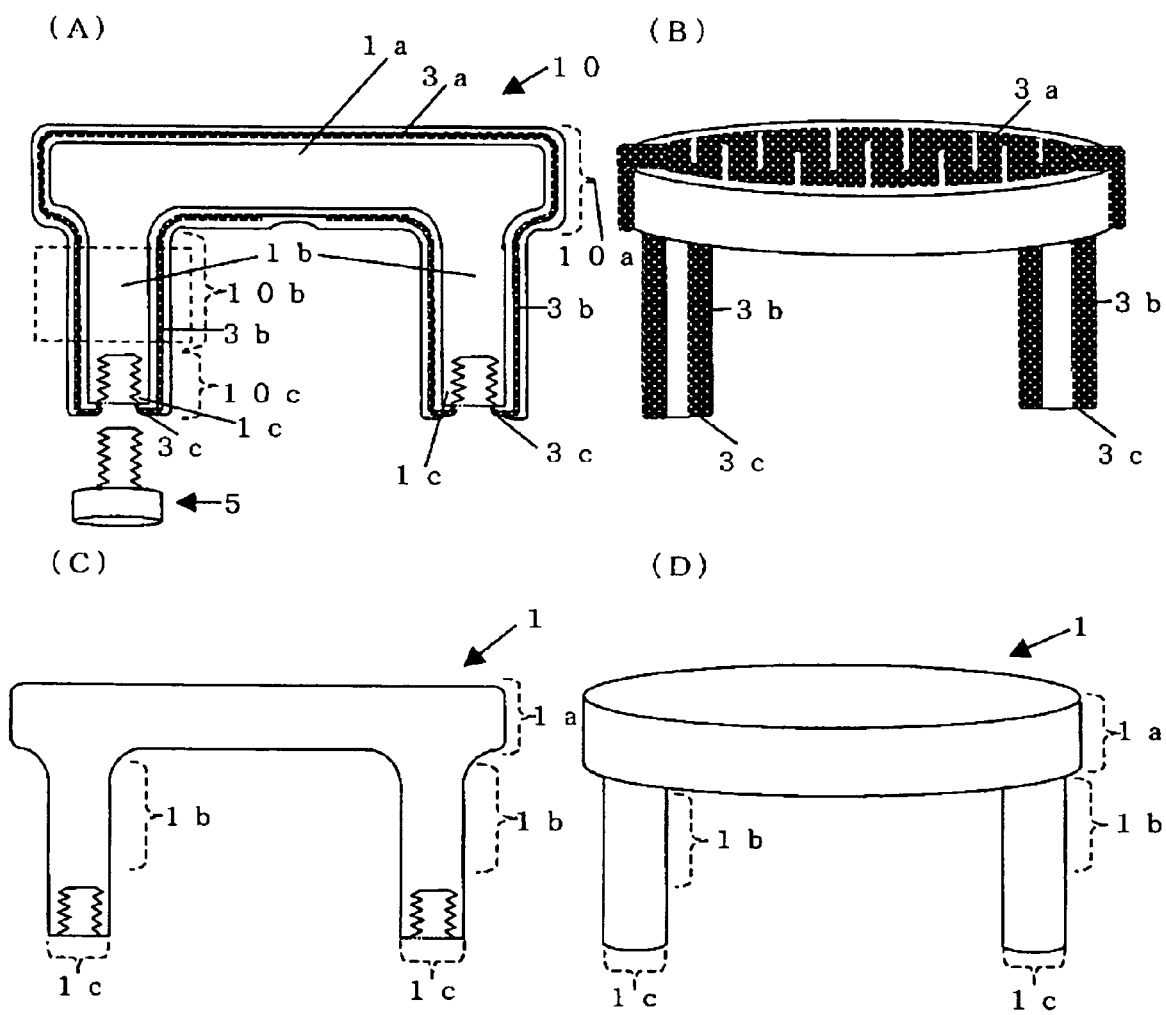
FIG. 2 is a schematic view of another embodiment (Example 2) of a heating element according to the present invention.

FIG. 1 and FIG. 2 are schematic views of embodiments of heating elements according to the present invention.

The present invention provides a heating element 10. The heating element 10 includes a single-piece heat-resistant base member 1 with a plate portion 1a in which a heater pattern 3a is formed, a rod portion 1b extending from one surface of the plate portion 1a and in which a current-carrying part 3b is formed, and an end portion 1c at an end of the rod portion 1b on the opposite side of the plate portion 1a and in which a power-supply terminal 3c is formed;

a dielectric layer 2 with insulating property on the surface of the heat-resistant base member 1;

a conductive layer 3 with conductive property on the dielectric layer 2, in which the conductive layer 3 is formed as the heater pattern 3a in the plate portion 1a, as the current-carrying part 3b in the rod portion 1b, and as the power-supply terminal 3c in the end portion 1c; and a protection layer 4 with insulating property which covers the surface of the heater pattern 3a and the current-carrying part 3b, in which the dielectric layer 2, the conductive layer 3 and the protection layer 4 are formed to unite with the heat-resistant base member 1.

In such a heating element 10, the heating portion 10a in which the heater pattern 3a is formed in the plate portion 1a and the power-supply-terminal portion 10c in which the power-supply terminal 3c is formed in the end portion 1c are separated by the conductive portion 10b in which the current-carrying part 3b is formed in the rod portion 1b. Thus the power-supply-terminal portion 10c remains at low temperature, and the exposed power-supply terminal 3c resists corrosion and deterioration due to high-temperature gases in a process environment.

In addition, the heat-resistant base member 1 is single-piece, and not assembled from plural components. Therefore, the base member is compact in size, and capable of being produced at a low cost. Furthermore, the whole member is made of an identical material, the layers 2, 3 and 4 formed on the heat-resistant base member 1 resist producing cracks through usage.

It is preferable that the heat-resistant base member 1 is made of graphite. Then, the material to produce the base member is low-cost, and easy to process to produce even a complicated shape. Therefore, the manufacturing cost of the base member can be reduced further. And such a base member has high heat-resistance. Besides, other materials with heat resistance such as sintered boron nitride can also be used.

The plate portion 1a satisfies the present invention as long as the dielectric layer 2, the heater pattern 3a and the protection layer 4 are formed in the plate portion 1a to provide the heating portion 10a. The plate portion 1a is not necessarily a circular plate as shown in FIG. 1 and FIG. 2. The plate portion la can be a polygonal plate.

The rod portion 1b satisfies the present invention as long as the rod portion 1b extends from one surface of the plate portion 1a and in which the dielectric layer 2, the current-carrying part 3b and the protection layer 4 are formed to provide the conductive portion 10b as shown in FIG. 1C. The rod portion 1b is not necessarily a cylinder as shown in FIG. 1 and FIG. 2. The rod portion 1b can be a prism. In addition, the rod portion 1b can be one portion as shown in FIG. 1, two portions as shown in FIG. 2, or more portions. The heating element in FIG. 2 has the heater pattern 3a in both surfaces of the plate portion 1a. The heater pattern 3a is energized via two pieces of the rod portion 1b and heated.

When the rod portion 1b is 10 to 200 mm long, the distance between the power-supply-terminal portion 10c and the heating portion 10a is long enough to reduce corrosion of the terminal portion more effectively.

The end portion 1c satisfies the present invention as long as the end portion 1c is at an end of the rod portion 1b on the opposite side of the plate portion 1a and in which the dielectric layer 2 and the power-supply terminal 3c are formed to provide the power-supply-terminal portion 10c. In the end portion, the protection layer 4 is not formed on the power-supply terminal 3c. Thus the power-supply terminal 3c is connected electrically to the power terminal 5 to feed direct current or alternating current.

In addition, when the rod portion 1b is one portion as shown in FIG. 1, the end portion 1c is preferably enlarged to form a plate as shown in FIG. 1 to provide structural stability.

The dielectric layer 2 satisfies the present invention as long as the dielectric layer 2 is made of a material with insulating property and heat resistance. When the dielectric layer is made of any one of boron nitride, pyrolytic boron nitride, silicon nitride, CVD silicon nitride, aluminum nitride and CVD aluminum nitride, or combination of boron nitride, pyrolytic boron nitride, silicon nitride, CVD silicon nitride, aluminum nitride or CVD aluminum nitride, the dielectric layer has high insulating property, and does not release impurities under high temperature conditions. Therefore, a heating element with such a dielectric layer can also be used for a heating process requiring high purity.

The conductive layer 3 is formed as the heater pattern 3a in the plate portion 1a, as the current-carrying part 3b in the rod portion 1b, and as the power-supply terminal 3c in the end portion 1c. And the protection layer 4 covers the surface of the heater pattern 3a and the current-carrying part 3b. The dielectric layer 2, the conductive layer 3 and the protection layer 4 are formed to unite with the heat-resistant base member 1. Therefore, the heating element is compact in size, and capable of being produced at a low cost. Furthermore, the conductive layer 3 is not assembled from plural components and resists exfoliating. The protection layer 4 does not produce cracks in the vicinity of a connected part of components through usage, and has a long life.

It is preferable that the conductive layer 3 is made of pyrolytic carbon or glassy carbon. Such a conductive layer 3 can be heated up to high temperature, and is easily worked. Therefore, the heater pattern is formed as a meandering pattern with different pattern widths, whereby the heater pattern can have arbitrary temperature gradient or heating distribution with reference to the thermal environments to heat uniformly. In particular, use of pyrolytic graphite is more preferable to further decrease the cost of producing heating elements. However, other materials which heats by the passage of electric current and has high heat resistance can also be used. The shape of the heater pattern is not limited to the meandering pattern (a zigzag pattern) in FIG. 1. For example, a concentric scroll pattern can also be used.

The heater pattern 3a is formed between the dielectric layer 2 and the protection layer 4 in the plate portion 1a. The heater pattern 3a heats by the passage of electric current and heats a target object sufficiently. As shown in FIG. 1 and FIG. 2, a pair of current-introducing portion connected to the current-carrying part 3b can be used. Besides, use of two or more pairs of current-introducing portion provides a heater with 2 or more zones which can be controlled independently.

The heater pattern 3a is preferably formed in a surface of the plate portion 1a which is opposite with another surface from which the rod portion 1b extends as shown in FIG. 1B and FIG. 2B. However, the heater pattern 3a can be formed in a surface of the plate portion 1a from which the rod portion 1b extends as shown in FIG. 3B. The heater pattern 3a can also be formed in both surfaces of the plate portion 1a.

The power-supply terminal 3c is formed on the dielectric layer 2 in the end portion 1c. The power-supply terminal 3c is connected to the power terminal 5, and the protection layer 4 with insulating property is not formed on the power-supply terminal 3c. The power terminal 5 is connected to the power-supply terminal 3c to feed direct current or alternating current to the conductive layer 3.

The current-carrying part 3b is formed between the dielectric layer 2 and the protection layer 4 in the rod portion lb. The current-carrying part 3b exists between the heater pattern 3a and the power-supply terminal 3c, and connects the power-supply terminal 3c to the heater pattern 3a. The current-carrying part 3b, the dielectric layer 2 and the protection layer 4 are formed to unite with the rod portion lb. In the case of the heater pattern 3a being formed in a first surface of the plate portion 1a which is opposite with a second surface from which the rod portion 1b extends as shown in FIG. 1 and FIG. 2, the current-carrying part 3b is formed in the side and the second surface of the plate portion la to connect with the heater pattern 3a.

The protection layer 4 with insulating property and heat resistance satisfies the present invention. The protection layer is preferably made of any one of boron nitride, pyrolytic boron nitride, silicon nitride, CVD silicon nitride, aluminum nitride and CVD aluminum nitride, or combination of boron nitride, pyrolytic boron nitride, silicon nitride, CVD silicon nitride, aluminum nitride or CVD aluminum nitride. Such a protection layer has high insulating property, and does not release impurities under high temperature conditions. Therefore, a heating element with such a protection layer can also be used for a heating process requiring high purity. Incidentally, pyrolytic boron nitride is resistant to hydrogen. However, fluoride corrodes pyrolytic boron nitride, and use of a protection layer made of pyrolytic boron nitride under fluoride environments is not recommended.

Figure 5:
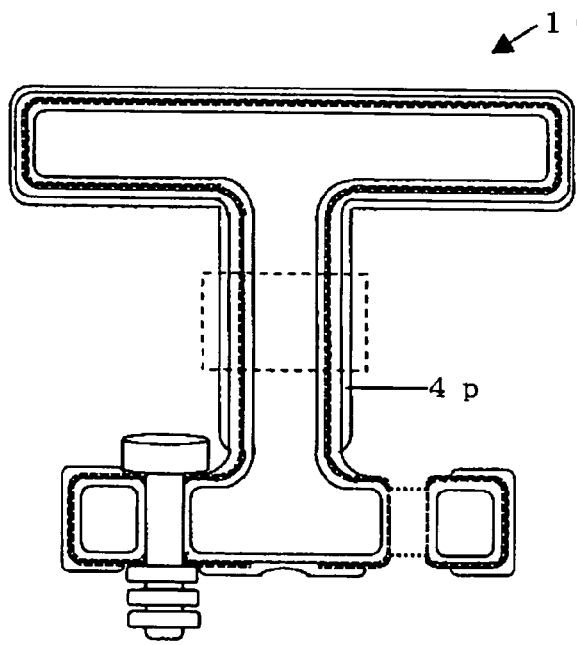
FIG. 5 is a schematic view of one embodiment of a heating element with a protection layer of 2 layers according to the present invention.
Figure 5:
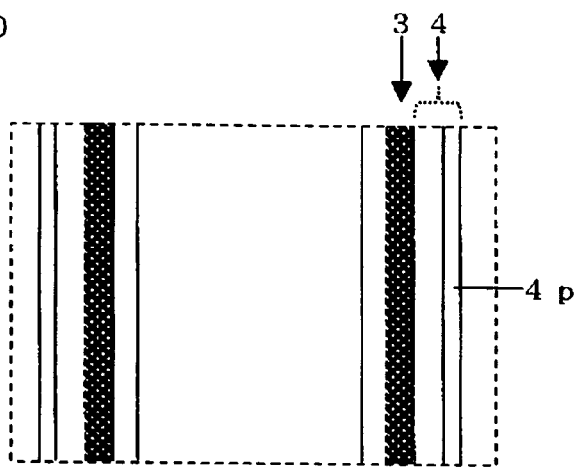
Figure 5:
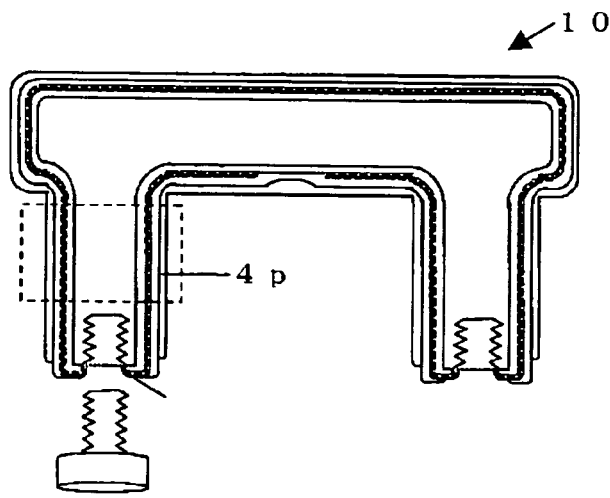

Furthermore, it is preferable that the protection layer 4 comprises at least 2 or more layers as shown in FIG. 5B, and an outermost layer 4p is made of any one of aluminum, yttrium, silicon, and a compound of aluminum, yttrium or silicon. A heating element with such a protection layer can be used with stability under a corrosive environment using halide etching gas, oxygen, etc. For example, the outermost layer can be made of metal aluminum or metal yttrium. Or, as to a compound of aluminum, yttrium or silicon, for example, alumina, aluminum fluoride, yttria, yttrium fluoride, silicon oxide can be used. Combination of two or more of metal aluminum, metal yttrium, alumina, aluminum fluoride, yttria, yttrium fluoride, silicon oxide can also be used. In such a case, the outermost layer is made of aluminum and so on. As for an under layer of the outermost layer to protect the conductive layer, an oxide or a conductive material is not preferable, and metal cannot be used for causing a short. Therefore, boron nitride, pyrolytic boron nitride and so on as mentioned above can preferably used for the under layer.

Figure 3:
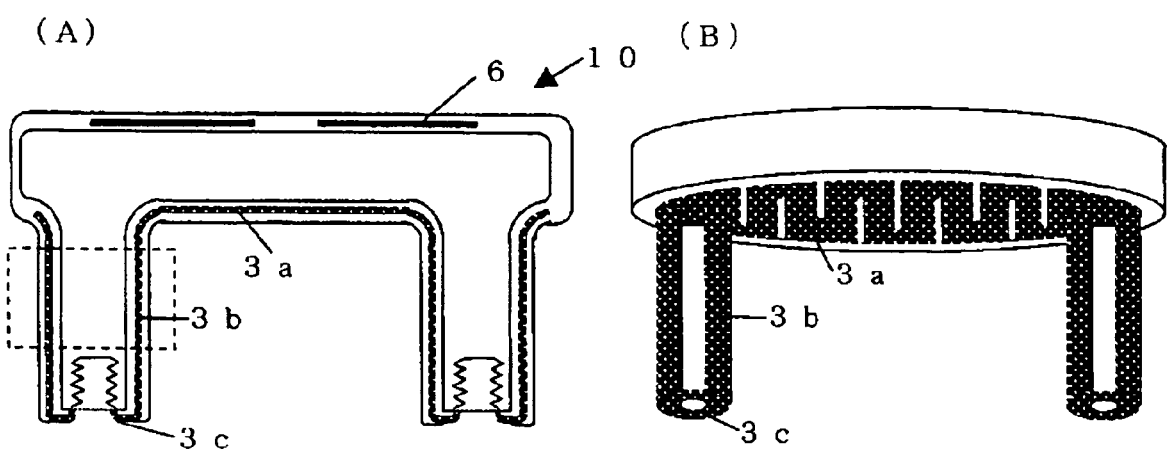
FIG. 3 is a schematic view of one embodiment of a heating element with an electrostatic-chuck pattern according to the present invention.

Furthermore, an electrostatic-chuck pattern 6 can be formed as shown in FIG. 3. The electrostatic-chuck pattern 6 is an electrode pattern providing static electricity to hold an object to be heated. In particular, the following heating element is preferable: the heater pattern 3a is formed on a surface of the plate portion 1a from which the rod portion 1b extends as shown in FIG. 3B; the electrostatic-chuck pattern 6 for holding an object to be heated is formed on another surface of the plate portion 1a as shown in FIG. 3A. In such a heating element, the object can be heated with being retained securely. Thus the object can be heated and positioned with high precision. Therefore, when it is required to position the object to be heated with high precision in ion implantation, plasma etching, sputtering and so on, desired heating process can be conducted more accurately with the heating element. When the chuck pattern is formed, a protection layer of the chuck pattern preferably has insulating property and contains nitride as mentioned above.

The heating element 10 of the present invention as explained above heats by being connected electrically with the power terminal 5. The heating portion 10a and the power-supply-terminal portion 10c are separated by the conductive portion 10b in which the current-carrying part 3b is formed in the rod portion 1b. Therefore, the power-supply terminal 3c exposed at the power-supply-terminal portion 10c resists corrosion due to high-temperature gases in a process environment, and the heating element has a long life.

In addition, the conductive layer 3 is formed as the heater pattern 3a, the current-carrying part 3b, and the power-supply terminal 3c. And the protection layer 4 covers the surface of the heater pattern 3a and the current-carrying part 3b. The dielectric layer 2, the conductive layer 3 and the protection layer 4 are formed to unite with the heat-resistant base member 1. Therefore, the heating element is compact in size, and capable of being produced at a low cost. Furthermore, the protection layer 4 resists producing cracks through usage, and has a long life.

EXAMPLE

Hereinafter, the present invention will be explained further in detail with reference to Examples and Comparative Example, however, the present invention is not limited thereto.

Example 1

A single-piece heat-resistant base member 1 as shown in FIG. 1 was prepared. The base member 1 was made of carbon and included a plate portion 1a, a rod portion 1b, and an end portion 1c. The plate portion 1a is 10 mm thick with an outside diameter of 250 mm. The rod portion 1b extends from one surface of the plate portion 1a. The rod portion 1b is 100 mm long with a diameter of 30 mm. The end portion 1c was at an end of the rod portion 1b on the opposite side of the plate portion 1a. The end portion 1c was a small circular plate which is 10 mm thick with a diameter of 60 mm. Four holes with a diameter of 6 mm to which a power terminal 5 can be connected were formed in the plate of the end portion 1c.

The heat-resistant base member 1 was placed in a thermal CVD reactor. A reaction gas mixed in the volume proportions of 4 parts ammonia to 1 part boron trichloride was fed to the surface of the base member 1. Reaction was carried out under conditions of 1900° C. and 1 Torr to form a dielectric layer 2 of pyrolytic boron nitride with 0.3 mm thick on the surface of the base member 1.

Next, methane gas was pyrolyzed under conditions of 1800° C. and 1 Torr to form a conductive layer 3 made of pyrolytic graphite with 0.1 mm thick. The conductive layer 3 was worked so that a heater pattern 3a was formed in the heating surface in the plate portion 1a, a current-carrying part 3b is formed in the side and the back surface of the plate portion 1a and in the rod portion 1b, and a power-supply terminal 3c was formed in the end portion 1c. Two power-supply terminals 3c were formed, and other two holes were left unused.

The base member 1 was again placed in the thermal CVD reactor with masking the power-supply terminals 3c. A reaction gas mixed in the volume proportions of 4 parts ammonia to 1 part boron trichloride was fed. Reaction was carried out under conditions of 1900° C. and 1 Torr to form a 0.1 mm thick protection layer 4 of pyrolytic boron nitride with insulating property on a surface of the heater pattern 3a and the current-carrying part 3b.

Thus produced heating element 10 in FIG. 1 was electrically connected to heat in vacuum of $1 \times 10^{-4}$ Pa. The heating portion 10a was heated up to 800° C. with 1.5 kW of electric power. At this time, the power-supply-terminal portion 10c was 150° C. The power-supply-terminal portion 10c thus remained much lower temperature than the heating portion 10a.

Then, hydrogen gas was fed to the vacuum to be $1 \times 10^{-2}$ Pa, and the heating element 10 heated as long as 200 hours. During 200 hours the terminal portion and the heater portion of the heating element 10 remained unchanged, and heating was conducted properly.

Furthermore, another heating element 10 in FIG. 5A was produced: an outermost layer 4p of aluminum nitride 10 m thick was formed by reactive sputtering on a surface of a heating element 10 in FIG. 1 produced as with above.

Thus produced heating element 10 was electrically connected to heat in vacuum of $1 \times 10^{-4}$ Pa. The heating portion 10a was heated up to 500° C. with 1.0 kW of electric power. At this time, the power-supply-terminal portion 10c was 150° C. The power-supply-terminal portion 10c thus remained much lower temperature than the heating portion 10a.

Then, $CF_4$ gas was fed to the vacuum to be $1 \times 10^{-2}$ Pa, and the heating element 10 heated as long as 200 hours. An amount of corrosion was 5 μm or less and heating was conducted unchangingly.

Example 2

A single-piece heat-resistant base member 1 as shown in FIG. 2 was prepared. The base member 1 was made of carbon and included a plate portion 1a, a pair of rod portion 1b, and an end portion 1c. The plate portion 1a is 10 mm thick with an outside diameter of 250 mm. The pair of rod portion 1b extends from two peripheral ends across a surface of the plate portion 1a respectively. The rod portion 1b is 50 mm long with a diameter of 20 mm. The end portion 1c was an end of the rod portion 1b on the opposite side of the plate portion 1a. At the end portion 1c, a hole 10 mm deep with a female M10 screw thread was formed to establish electric connections with a screw.

The heat-resistant base member 1 was placed in a thermal CVD reactor. A reaction gas mixed in the volume proportions of 4 parts ammonia to 1 part boron trichloride was fed to the surface of the base member 1. Reaction was carried out under conditions of 1900° C. and 1 Torr to form a dielectric layer 2 of pyrolytic boron nitride with 0.3 mm thick on the surface of the base member 1.

Next, methane gas was pyrolized under conditions of 1800° C. and 3 Torr to form a conductive layer 3 of pyrolytic graphite with 0.1 mm thick. The conductive layer 3 was worked so that a heater pattern 3a was formed in the heating surface in the plate portion 1a, a current-carrying part 3b is formed in the rod portion 1b, and a power-supply terminal 3c was formed in the end portion 1c.

The heat-resistant base member 1 was again placed in the thermal CVD reactor with masking the power-supply terminals 3c. A reaction gas mixed in the volume proportions of 4 parts ammonia to 1 part boron trichloride was fed. Reaction was carried out under conditions of 1900° C. and 1 Torr to form a 0.1 mm thick protection layer 4 of pyrolytic boron nitride with insulating property on a surface of the heater pattern 3a and the current-carrying part 3b.

Thus produced heating element 10 in FIG. 2 was electrically connected to heat in vacuum of $1 \times 10^{-4}$ Pa. The heating portion 10a was heated up to 800° C. with 1.5 kW of electric power. At this time, the power-supply-terminal portion 10c was 200° C. The power-supply-terminal portion 10c thus remained much lower temperature than the heating portion 10a.

Then, hydrogen gas was fed to the vacuum to be $1 \times 10^{-2}$ Pa, and the heating element 10 heated as long as 200 hours. During 200 hours the terminal portion of the heating element 10 remained unchanged, and heating was conducted properly.

Furthermore, another heating element 10 in FIG. 5C was produced: an outermost layer 4p of yttria with 10 μm thick was formed by plasma spray coating on a surface of a heating element 10 in FIG. 2 produced as with above.

Thus produced heating element 10 was electrically connected to heat in vacuum of $1 \times 10^{-4}$ Pa. The heating portion 10a was heated up to 500° C. with 1.0 kW of electric power. At this time, the power-supply-terminal portion 10c was 150° C. The power-supply-terminal portion 10c thus remained much lower temperature than the heating portion 10a.

Then, $CF_4$ gas was fed to the vacuum to be $1 \times 10^{-2}$ Pa, and the heating element 10 heated as long as 200 hours. An amount of corrosion after a lapse of 200 hours was very small of 10 μm.

Comparative Example

A single-piece heat-resistant base member 21 in FIG. 4 was prepared. The base member 1 was a plate made of carbon, 10 mm thick, with an outside diameter of 250 mm. Two holes were formed at peripheral ends across the surface of the plate to establish electric connections with a screw. The hole was 10 mm deep with a female M10 screw thread. The diameter of the hole was larger than a M10 screw by 0.4 mm.

The heat-resistant base member 21 was placed in a thermal CVD reactor. A reaction gas mixed in the volume proportions of 4 parts ammonia to 1 part boron trichloride was fed to the surface of the base member 1. Reaction was carried out under conditions of 1900° C. and 1 Torr to form a dielectric layer 2 of pyrolytic boron nitride with 0.3 mm thick on the surface of the base member 21.

Next, methane gas was pyrolyzed under conditions of 1800° C. and 3 Torr to form a conductive layer 3 of pyrolytic graphite with 0.1 mm thick. The conductive layer 3 was worked so that a heater pattern 3a was formed on the heating surface of the base member, and power-supply terminals 3c were formed at peripheral ends across the heating surface.

The base member 21 was again placed in the thermal CVD reactor with masking the power-supply terminals 3c. A reaction gas mixed in the volume proportions of 4 parts ammonia to 1 part boron trichloride was fed. Reaction was carried out under conditions of 1900° C. and 1 Torr to form a 0.1 mm thick protection layer 4 of pyrolytic boron nitride with insulating property on a surface of the heater pattern 3a.

Thus produced heating element 20 in FIG. 4 was electrically connected to heat in vacuum of $1 \times 10^{-4}$ Pa. The heating element 20 heated up to 800° C. with 1.5 kW of electric power. At this time, the power-supply-terminal portion was 480° C. and substantially did not resist being heated.

Then, hydrogen gas was fed to the vacuum to be $1 \times 10^{-2}$ Pa, and the heating element 20 heated. After a lapse of 75 hours, carbon of the power-supply terminal 3c was corroded and the heating element 20 was disconnected.

Furthermore, the heating element 20 heated up to 500° C. with 1.0 kW of electric power, and $CF_4$ gas was fed to the environment. After a lapse of 10 hours, an outermost layer of boron nitride was lost. And the conductive layer 3 such as the heater pattern 3a produces cracks, and the heating element 20 was disconnected.

The present invention is not limited to the above-described embodiments. The above-described embodiments are mere examples, and those having the substantially same structure as that described in the appended claims and providing the similar action and advantages are included in the scope of the present invention.

For example, the cases of forming the dielectric layer 2 and the protection layer 4 of pyrolytic boron nitride were described in the above embodiments. However, a case of using other materials such as silicon nitride or aluminum nitride to form those layers is also included in the scope of the present invention.

What is claimed is:

1. A heating element comprising: at least
   a single-piece heat-resistant base member with a plate portion in which a heater pattern is formed, a rod portion extending from one surface of the plate portion and in which a current-carrying part is formed, and an end portion at an end of the rod portion on the opposite side of the plate portion and in which a power-supply terminal is formed;
   a dielectric layer with insulating property on the surface of the heat-resistant base member;
   a conductive layer with conductive property on the dielectric layer, in which the conductive layer is formed as the heater pattern in the plate portion, as the current-carrying part in the rod portion, and as the power-supply terminal in the end portion; and
   a protection layer with insulating property which covers the surface of the heater pattern and the current-carrying part, in which the dielectric layer, the conductive layer and the protection layer are formed to unite with the heat-resistant base member;

wherein the end portion of the single-piece heat-resistant base member is enlarged a second the plate portion and the power-supply terminal is formed in the enlarged part of the end portion.

2. The heating element according to claim 1, wherein the heat-resistant base member is made of graphite.

3. The heating element according to claim 1, wherein the dielectric layer is made of any one of boron nitride, pyrolytic boron nitride, silicon nitride, CVD silicon nitride, aluminum nitride and CVD aluminum nitride, or combination of boron nitride, pyrolytic boron nitride, silicon nitride, CVD silicon nitride, aluminum nitride or CVD aluminum nitride.

4. The heating element according to claim 2, wherein the dielectric layer is made of any one of boron nitride, pyrolytic boron nitride, silicon nitride, CVD silicon nitride, aluminum nitride and CVD aluminum nitride, or combination of boron nitride, pyrolytic boron nitride, silicon nitride, CVD silicon nitride, aluminum nitride or CVD aluminum nitride.

5. The heating element according to claim 1, wherein the conductive layer is made of pyrolytic carbon or glassy carbon.

6. The heating element according to claim 4, wherein the conductive layer is made of pyrolytic carbon or glassy carbon.

7. The heating element according to claim 1, wherein the protection layer is made of any one of boron nitride, pyrolytic boron nitride, silicon nitride, CVD silicon nitride, aluminum nitride and CVD aluminum nitride, or combination of boron nitride, pyrolytic boron nitride, silicon nitride, CVD silicon nitride, aluminum nitride or CVD aluminum nitride.

8. The heating element according to claim 6, wherein the protection layer is made of any one of boron nitride, pyrolytic boron nitride, silicon nitride, CVD silicon nitride, aluminum nitride and CVD aluminum nitride, or combination of boron nitride, pyrolytic boron nitride, silicon nitride, CVD silicon nitride, aluminum nitride or CVD aluminum nitride.

9. The heating element according to claim 1, wherein the protection layer comprises at least 2 or more layers, and an outermost layer is made of any one of aluminum, yttrium, silicon, and a compound of aluminum, yttrium or silicon.

10. The heating element according to claim 8, wherein the protection layer comprises at least 2 or more layers, and an outermost layer is made of any one of aluminum, yttrium, silicon, and a compound of aluminum, yttrium or silicon.

11. The heating element according to claim 1, wherein the rod portion is 10 to 200 mm long.

12. The heating element according to claim 10, wherein the rod portion is 10 to 200 mm long.

13. The heating element according to claim 1, wherein the heater pattern is formed in the surface of the plate portion from which the rod portion extends, and an electrostatic-chuck pattern for holding an object to be heated is formed in the opposite surface of the plate portion.

14. The heating element according to claim 12, wherein the heater pattern is formed in the surface of the plate portion from which the rod portion extends, and an electrostatic-chuck pattern for holding an object to be heated is formed in the opposite surface of the plate portion.

* * * * *